United States Patent
Ota

[11] 3,936,857
[45] Feb. 3, 1976

[54] INSULATED GATE FIELD EFFECT TRANSISTOR HAVING HIGH TRANSCONDUCTANCE

[75] Inventor: Michihiro Ota, Tokyo, Japan

[73] Assignee: Nippon Electric Co., Ltd., Tokyo, Japan

[22] Filed: June 28, 1974

[21] Appl. No.: 484,350

[30] Foreign Application Priority Data
July 2, 1973   Japan.................................. 48-74612

[52] U.S. Cl. ...................... 357/23; 148/1.5; 357/91
[51] Int. Cl.² .......................................... H01L 29/78
[58] Field of Search............................ 357/23, 24, 91

[56] References Cited
UNITED STATES PATENTS
3,615,934   10/1971   Bower................................... 357/23

OTHER PUBLICATIONS
Shimizu et al., "Charge-coupled devices," Appl. Phys. Lett., Vol. 22, No. 6, Mar. 15, 1973, pp. 286–287.

*Primary Examiner*—William D. Larkins
*Attorney, Agent, or Firm*—Hopgood, Calimafde, Kalil, Blaustein & Lieberman

[57] ABSTRACT

An insulated gate field effect transistor having improved high-frequency operating characteristics includes an extended region electrically connected to one of the source and drain regions and spaced from the surface of the substrate. The extended region extends toward the other of the source and drain regions such that the distance between the source and drain regions is relatively small within the substrate and relatively large at the surface of the substrate.

8 Claims, 10 Drawing Figures

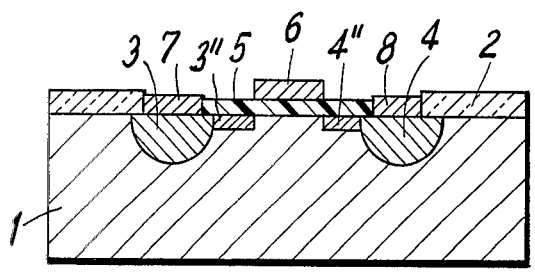
(PRIOR ART)
FIG.1a
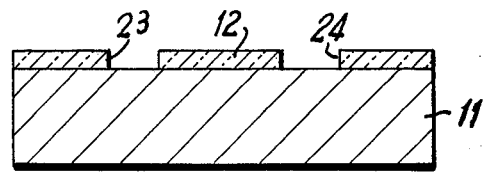
FIG.2a
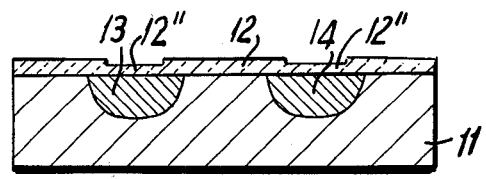
FIG.2b
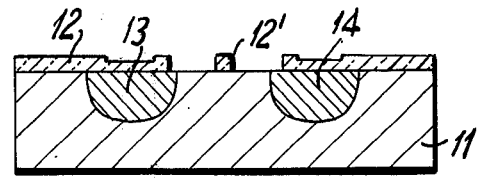
FIG.2c
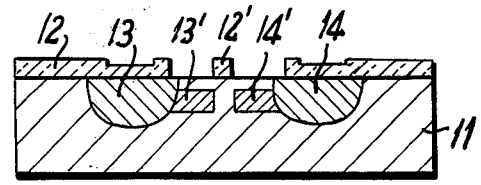
FIG.2d
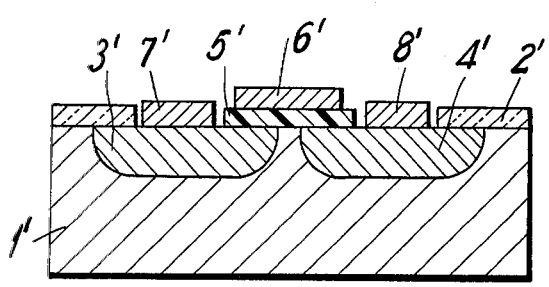
(PRIOR ART)
FIG.1b
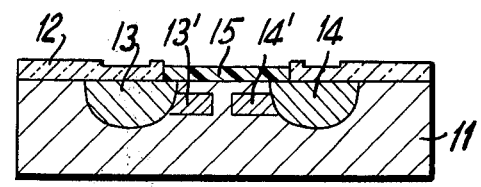
FIG.2e
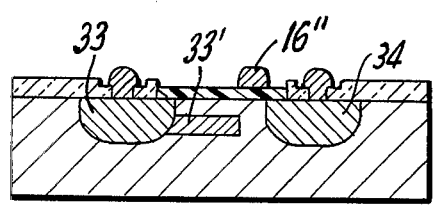
FIG.3a
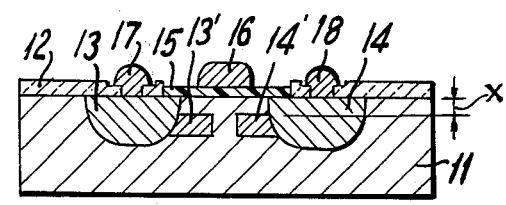
FIG.2f
FIG.3b

INSULATED GATE FIELD EFFECT TRANSISTOR HAVING HIGH TRANSCONDUCTANCE

The present invention relates generally to insulated gate field effect transistors (IGFETs) and, more particularly, to improved metal-oxide semiconductor field effect transistor (MOS FET) for high frequency use. Although an MOS FET having a gate-insulation film formed of silicon oxide is specifically referred to in this specification for the purpose of illustrating the invention, the principles of the invention are also applicable to other types of IGFET, such as MOS FET's with gate insulation films formed of other insulating materials.

A conventional MOS FET consists essentially of a semiconductor substrate, a source region and a drain region, both formed at the surface of the substrate, a gate insulation film formed on the substrate and extending to both the source and drain regions, and metal electrodes formed respectively on the gate insulation film, drain, and source regions. When a voltage is applied between the gate electrode and the semiconductor substrate, the conductivity of the channel region at the substrate surface beneath the gate insulation film changes, whereby the quantity of charge flowing between the source and drain regions is controlled.

The electrical characteristics of the MOS FET in the high frequency region depend largely upon the parasitic capacitances such as the capacitance of the gate insulation film, the capacitance between the gate and the source regions, and the capacitance between the gate and the drain region, as well as upon the transconductance of the channel region. In other words, the cutoff frequency of the MOS FET is inversely proportional to the total parasitic capacitance and is directly proportional to the transconductance. Therefore, in an MOS field effect transistor for high frequency applications, the parasitic capacitances should be low and the transconductance should be high.

Efforts have been devoted to satisfy these desired conditions. One approach to the reduction of the parasitic capacitance is the self-aligning method, in which source and drain regions are formed in the substrate an insulation film is disposed on the substrate except for the source and drain regions and the region between the source and drain regions, a gate insulation film is disposed on one part of the substrate between the source and drain regions, and a gate electrode is deposited to partially cover the gate insulation film. Ions capable of determining conductivity type to be the same as that of the source and drain regions are then introduced through the portion of the gate insulation film not covered with the gate electrode by an ion implantation process. This implantation process is performed by using the gate electrode as a mask, whereby regions of the substrate between the source region and the gate electrode and between the drain region and the gate electrode change their conductivity type to form the extended source and drain regions. In more detail, a thin silicon dioxide film is formed on the surface of the substrate covering the region where impurity ions are to be implanted thereafter, and the impurity is then introduced therein through the thin silicon dioxide film to permit the extended regions to be formed at the surface of the substrate. In such an FET structure, the capacitances between the gate and the source region and between the gate and the drain region, can be reduced since no overlap portion exists between the gate electrode and the source region and between the gate electrode and the drain region. However, the reduction in the parasitic capacitance is limited because the gate electrode is close to the source and the drain region.

In order to increase the transconductance, a method of narrowing the distance between the source and the drain regions has been proposed. According to this method, an impurity of the conductivity type opposite to that of the substrate is diffused into spaced surface regions of the substrate through windows, until the space between the diffused regions is narrowed. Such diffused regions are employed as a source region and a drain region. After this step, a gate insulation film and electrodes are formed. In this FET structure, however, the capacitance between the gate and the source region and the capacitance between the gate and the drain regions are high; that is, the parasitic capacitance is high. Accordingly, these prior art MOS FET's are not suited for applications where a high cutoff frequency is important.

In the prior art MOS field effect transistor, the threshold voltage depends chiefly upon the impurity concentration in the channel region of the substrate. Hence, the threshold voltage can be controlled by adding an impurity into the channel region by diffusion or ion implantation. This technique, however, gives rise to the drawback that the drain withstand voltage is lowered, because the breakdown voltage of the junction between the substrate and drain region is lowered when the impurity concentration in the channel region is increased in order to provide a high threshold voltage, and because the punch-through voltage between the source and drain regions is also lowered when the impurity concentration in the channel region is decreased in order to provide a low threshold voltage.

It is, therefore, an object of the invention to provide an insulated gate field effect transistor having higher cutoff frequency characteristic.

It is another object of the invention to provide an insulated gate field effect transistor in which the threshold voltage can be controlled without lowering the drain withstand voltage.

It is a further object of the invention to provide an insulated gate field effect transistor having a low parasitic capacitance and a high transconductance.

With these and other objects in view, the invention provides an insulated gate field effect transistor constructed so that at least one extended region electrically connected to the source or drain region and located between the source and drain regions is formed within the substrate away from its surface so as to make the distance between the source and drain regions small within the semiconductor substrate and large at the surface of the substrate. The gate electrode is located on the gate insulation film which is disposed on the substrate between the source and drain regions and is also positioned above the region in the substrate where the distance between the source and drain regions is minimum.

Thus, according to the invention, the gate electrode is sufficiently distant from the source and drain regions to allow the parasitic capacitance to be minimized. Furthermore, the transconductance is increased because the distance between the source and drain regions is sufficiently low and the conduction channel is induced to be thick enough as soon as the drain current begins to flow. The invention, therefore, provides an insulated gate field effect transistor which is able to operate at higher cutoff frequencies.

In the insulated gate field effect transistor of the invention, the threshold voltage $V_{TH}$ can be arbitrarily controlled by suitably determining the depths of the extended regions of the source and/or drain regions from the surface of the substrate because the drain current begins to flow after the conduction channel induced by the gate voltage reaches the extended regions of the source and/or drain regions within the substrate. Because the threshold voltage $V_{TH}$ can be controlled irrespective of the impurity concentration in the substrate, there is no reduction of the drain breakdown potential.

The above and further objects, features and advantages of the invention will become more apparent from the following description taken in conjunction with the accompanying drawings, wherein:

FIGS. 1a and 1b are sectional views showing structural features of conventional MOS field effect transistors;

FIGS. 2a through 2f are sectional views of a MOS field effect transistor according to an embodiment of the invention in the steps of its production process; and FIGS. 3a and 3b are sectional views showing structural features of MOS field effect transistors according to other embodiments of the invention.

Referring now to FIG. 1a, the field effect transistor of one conventional type is made according to the previously mentional self-aligning method so that the overlap between a gate electrode 6 and a source region 3 (including an extended region 3″) and between the gate electrode 6 and a drain region 4 (including an extended region 4″) is minimized. This MOS FET is constructed in the following manner. A silicon dioxide film 2 is formed on an n-type semiconductor substrate 1. Openings are formed by the well-known photoetching technique in the silicon dioxide film 2 above the separate regions which are to become respectively the source and the drain. A p-type impurity is diffused therein through the openings whereby a source region 3 and a drain region 4 are formed. Part of the silicon dioxide film 2 located between the source region and the drain region is removed, and a silicon dioxide gate-insulation film 5 is formed in the removed area. Metal electrodes 6, 7 and 8 are formed respectively on part of the gate insulation film, the drain region 4, and source region 3. These electrodes serve respectively as the gate electrode 6, the drain electrode 8, and the source electrode 7. Then p-type impurity ions are implanted into the substrate 1 through the gate insulation film 5 to form the extended source and drain regions 3″ and 4″. The energy of ion implanation is so determined that the peak of the impurity concentration appears at the surface of the substrate 1.

In an MOS FET such as that shown in FIG. 1a, the gate-source capacitance and the gate-drain capacitance are both very low since there are no overlap portions between the gate electrode 6 and the source region 3 (including the extended region 3″) and between the gate electrode 6 and the drain region 4 (including the extended region 4″). These capacitances, however, are still not low enough because the distances from the gate electrode 6 to the extended regions 3″ and 4″ are very short.

In the MOS FET shown in FIG. 1b, the channel length is sufficiently reduced to increase the transconductance. This MOS FET is fabricated in the following manner. A silicon dioxide film 2′ is formed on an n-type substrate 1′. Openings are formed in the silicon dioxide film 2′, through which a p-type impurity is diffused, whereby a source region 3′ and a drain region 4′ are formed. The amount of impurity diffused sufficient such that the source region 3′ and the drain region 4′ become close enough to each other. Part of the silicon dioxide film 2′ located above the region between the source and drain regions is removed, and a silicon dioxide gate-insulation film 5′ is formed at the removed area. Then a source electrode 7′, a drain electrode 8′, and a gate electrode 6′ are formed on the source region 3′, the drain reion 4′, and the gate insulation film 5′, respectively.

In the MOS FET of FIG. 1b, the transconductance is large because the distance between the source region 3′ and the drain region 4′ is relatively small. On the other hand, however, the gate-source capacitance and the gate-drain capacitance become large because the gate electrode 6′ overlaps the source region 3′ and the drain region 4′ through the gate insulation film 5′.

Accordingly, both the prior art MOS FET's are unable to operate at a substantially high cutoff frequency, the FET of FIG. 1a because of the relatively high capacitances. Furthermore, in the prior art MOS FET's, the impurity concentration in the channel region between the extended regions 3″ and 4″ or between the source region 3′ and the drain region 4′ in the substrate must be increased in order to increase the threshold voltage $V_{TH}$, but at the sacrifice of the drain breakdown voltage.

Referring to the embodiment of the invention illustrated in FIG. 2, a silicon oxide film 12 (FIG. 2a) of 1.5 micron thick is formed on the entire surface of a silicon substrate 11 of n-type conductivity with a low impurity concentration, e.g., $10^{14}$ to $10^{16}$ cm$^{-3}$, preferably $1 \times 10^{15}$ cm$^{-3}$. The silicon oxide film preferably has a thickness of at least 0.2 micron in order to operate as a mask for ion implantation. Windows 23 and 24 for impurity diffusion to form source and drain regions 13 and 14 are opened sufficiently apart from each other in the silicon oxide film a well-known photo-resist technique. The distance between windows 23 and 24 is preferably 10 microns or more. Then, as shown in FIG. 2b, an impurity such as boron offering a conductivity type opposite to that of the substrate 11 is diffused into the substrate 11 whereby a source region 13 and drain region 14 are formed to a depth of about 2 microns. Then the windows are covered with silicon oxide films 12″ of 1.5 microns thick. As shown in FIG. 2c, windows for forming extended regions of the source and drain regions 13 and 14 are opened in the silicon oxide film 12 between regions 13 and 14 by a photo-etching technique, leaving a band-like silicon oxide film 12′ to a width of 1 to 3 microns, preferably 2 microns. In the next step, as shown in FIG. 2d, impurity ions such as boron ions offering the same conductivity type as that of the source and drain regions 13 and 14 are implanted over the entire surface of the substrate 11 by an ion implantation process at an acceleration voltage of 100 to 200 KeV, preferably 150 KeV, to a dose of $10^{12}$ to $10^{16}$ cm$^{-2}$, preferably $1 \times 10^{14}$ cm$^{-2}$. In this step, the boron ions are implanted deep into the substrate but shallowly into the silicon oxide films 12 and 12′. Therefore, no boron ions reach the surface of the substrate 11 beneath the silicon oxide films 12 and 12′. On the other hand, boron ions implanted into the exposed surface of substrate 11 penetrate into the substrate and reach a depth of between 0.05 to 1.0 micron from the surface of the substrate. Then, the semiconductor body is subjected to heat treatment at a temperature of 900° to 1,000°C for 10 to 30 minutes whereby an extended source region 13' and the extended drain region 14' with an impurity concentration of $2 \times 10^{16}$ to $10^{20}$ cm$^{-3}$ are formed in electrical connection to the source region 13 and the drain region 14 within the substrate 11, respectively. As a consequence of the formation of the extended source and drain regions 13 and 14', the distance between the source region 13 and the drain region 14 becomes equivalent to 1 to 3 microns which is the distance between the extended source region 13' and the extended drain region 14'. Then, as shown in FIG. 2e, the silicon oxide film 12' at the gate area is removed by a photoresist technique, and a gate insulation film 15 of 1,500A thick is formed. In the next step, as shown in FIG. 2f, windows are opened in the silicon oxide film 12'' located above the source region 13 and drain region 14, and aluminum or another conductive material is deposited and partly etched away, thereby forming a gate electrode 16, a source electrode 17, and a drain electrode 18 on the gate insulation film 15, the source region 13, and the drain region 14, respectively. The gate electrode 16 is smaller in size than the gate insulation film 15 and larger than the minimum distance between the extended source and drain regions 13' and 14' and is located above the region between the extended source region 13' and the extended drain region 14'. In a preferable example, the width of the gate electrode 16 is 5 microns.

According to the MOS FET of the invention, the gate electrode 16 does not overlap the source and drain regions 13 and 14, but overlaps only the extended source and drain regions 13' and 14' with the interposition of not only the gate insulation film 15 but also the surface portion of the substrate 11. This results in the reduction of the gate-source capacitance and the gate-drain capacitance. Furthermore, according to the invention, when the drain current flows, the transconductance gm is large because of the small channel length between the extended source region 13' and the extended drain region 14' and because of the high conductivity in the channel owing to the thick channel. Therefore, the invention makes it readily feasible to realize a MOS FET operable at a sufficiently high cutoff frequency.

In this MOS FET, the threshold voltage $V_{TH}$ is a function of the depth of the extended source and drain regions 13' and 14' as indicated by the distance $x$ shown in FIG. 2f. Accordingly, the threshold voltage $V_{TH}$ can be determined irrespective of the impurity concentration of the substrate 11. This enables a sufficiently high drain breakdown voltage to be maintained even if the threshold voltage is high.

Referring now to FIGS. 3a and b, another embodiment of the invention will be described. The MOS FET's of these embodiments can be fabricated by substantially the same process as that of the embodiment of FIG. 2. Therefore, description will be directed only to the differences in the completed structures from the embodiment of FIG. 2. A single extended region 34' (FIG. 3a) or 33' (FIG. 3b is formed to the source region 34 or the drain region 33, extends toward the other of the source and drain regions, and is spaced from the surface of the substrate. The gate electrode 16' overlaps only a small portion of the drain region 33 and the extended region (FIG. 3a), whereas in the embodiment of FIG. 3b the gate electrode 16'' overlaps only a portion of the source region and a portion of extended region 33'. In both of these embodiments the gate electrode overlies the space between the extended region (33' or 34') and the source or drain region toward which it extends. In these embodiments, while the reduction of the parasitic capacitance is slightly sacrificed, the other advantages are similar to those of the embodiment illustrated in FIG. 2 and the resultant MOS FET's are still useful and meet the purpose of the present invention.

The invention is not intended to be limited to the foregoing embodiments particularly described hereinabove, but is also applicable to other MOS FET's in various forms. For example, the upper surface of the extended regions 13' and 14' is preferably located at a depth of 0.01 to 2.0 microns from the surface of the substrate, and the location thereof should be selected to obtain a desired threshold voltage $V_{TH}$ of the FET. On the other hand, the bottom depth of the extended source and drain regions 13' and 14' is not limited. It is desirable for lowering the resistance of the source and/or drain regions that the bottom be as deep as possible, but the bottom depth is naturally limited by the possible depth of the ion implantation. An FET having a semiconductor substrate of silicon has been described, but it is to be appreciated that other materials such as GaAs and Ge may be successfully used for the semiconductor substrate. As the material for the gate insulation film, $SiO_2$, $Al_2O_3$, $Si_3N_4$ and their compounds may be also used.

The extended source and drain regions may be first formed by an ion implantation process and the source and drain regions may then be formed by diffusing an impurity through the substrate surface. The source and drain regions are not limited to the disclosed configuration and the space between the source and the drain regions may be arranged to be wide at the surface of the substrate and narrow toward the bottom of the substrate.

It is apparent that the invention is applicable not only to MOS FET's but also to the other type of IGFET's. The IGFET of the invention is highly practical when used as a discrete FET element or as a constituent FET element in an integrated circuit.

Accordingly, it is to be understood that variations to the particularly described embodiments may be made by those skilled in the art without necessarily departing from the spirit and scope of the invention.

What is claimed is:

1. An insulated gate field effect transistor comprising a semiconductor substrate of one conductivity type, source and drain regions of the opposite conductivity type formed in said semiconductor substrate, at least one extended region of said opposite conductivity type electrically connected to and extending from one of said source and drain regions toward the other of said source and drain regions, said at least one extended region being formed within said semiconductor substrate and electrically isolated from the other of said source and drain regions by a gap, a gate insulation film formed on said surface of said semiconductor substrate between said source and drain regions, and a gate electrode formed on said gate insulation film, said gate electrode overlying said gap and overlapping at least a part of said extended region.

2. The field effect transistor of claim 1, in which first and second ones of said extended regions are electrically connected to said source and drain regions respectively and extend toward one another, a gap being defined by said first and second extended regions.

3. The field effect transistor of claim 1, in which said gate electrode is spaced inwardly from each of said source and drain regions and overlies said gap.

4. The field effect transistor of claim 3, in which the upper surfaces of said extended regions are located at a distance from said surface of said substrate of between 0.01 and 2.0 microns.

5. The field effect transistor of claim 3, in which the upper surfaces of said extended regions are located at a distance from said surface of said substrate of between 0.05 and 1.0 microns.

6. The field effect transistor of claim 4, in which the width of said gap is between 1 and 3 microns.

7. The field effect transistor of claim 1, in which said gate electrode overlies the area of said substrate between said extended region and the other of said source and drain regions.

8. The field effect transistor of claim 1, in which the impurity concentration of said semiconductor substrate is substantially uniform and between $10^{14}$ and $10^{16}/cm^3$.

* * * * *

UNITED STATES PATENT OFFICE
CERTIFICATE OF CORRECTION

Patent No. 3,936,857     Dated February 3, 1976

Inventor(s) Michihiro Ota

It is certified that error appears in the above-identified patent and that said Letters Patent are hereby corrected as shown below:

In the caption, please change Assignee: "Nippon Electric Co., Ltd." to -- Nippon Electric Company, Limited --.

Signed and Sealed this

Thirteenth Day of July 1976

[SEAL]

Attest:

RUTH C. MASON
Attesting Officer

C. MARSHALL DANN
Commissioner of Patents and Trademarks